(12) United States Patent
Kimura

(10) Patent No.: US 6,690,090 B2  
(45) Date of Patent: Feb. 10, 2004

(54) SEMICONDUCTOR DEVICE HAVING RELIABLE COUPLING WITH MOUNTING SUBSTRATE

(75) Inventor: Naoto Kimura, Kumamoto (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/056,035

(22) Filed: Jan. 28, 2002

(65) Prior Publication Data

US 2002/0100977 A1 Aug. 1, 2002

(30) Foreign Application Priority Data

Jan. 26, 2001 (JP) ......................... 2001-019298

(51) Int. Cl.$^7$ .............................. H01L 23/48
(52) U.S. Cl. .................. 257/738; 257/734; 257/737; 257/779; 257/780
(58) Field of Search ................ 257/621, 673, 257/687, 734, 735, 736, 737, 738, 739, 750, 780; 438/123, 611, 612, 613, 411, 461

(56) References Cited

U.S. PATENT DOCUMENTS

| | | | | |
|---|---|---|---|---|
| 4,926,241 A | * | 5/1990 | Carey | 257/698 |
| 6,215,670 B1 | * | 4/2001 | Khandros | 257/750 |
| 6,274,823 B1 | * | 8/2001 | Khandros et al. | 257/750 |
| 6,300,685 B1 | * | 10/2001 | Hasegawa et al. | 257/780 |
| 6,476,503 B1 | * | 11/2002 | Imamura et al. | 257/780 |
| 6,482,730 B1 | * | 11/2002 | Masumoto et al. | 438/617 |
| 6,495,916 B1 | * | 12/2002 | Ohuchi et al. | 257/737 |
| 6,531,768 B2 | * | 3/2003 | Miyamoto | 257/687 |

FOREIGN PATENT DOCUMENTS

| | | | | |
|---|---|---|---|---|
| JP | 8-55856 | 2/1996 | | |
| JP | 8-236575 | 9/1996 | | |
| JP | 08-236575 | * 9/1996 | ............... | 21/60 |
| JP | 9-260428 | 10/1997 | | |
| JP | 10-303244 | 11/1998 | | |
| JP | 11-224920 | 8/1999 | | |
| JP | 11-243160 | 9/1999 | | |
| JP | 2000-31187 | 1/2000 | | |
| JP | 2000-200804 | 7/2000 | | |
| JP | 2000-243874 | 9/2000 | | |
| JP | 2000-311915 | 11/2000 | | |
| JP | 2001-269797 | 10/2001 | | |

* cited by examiner

Primary Examiner—Shouxiang Hu  
Assistant Examiner—Quang Vu  
(74) Attorney, Agent, or Firm—Young & Thompson (57) ABSTRACT

A downsized semiconductor device comprises a plurality of bonding pads formed on a surface of a semiconductor chip. A plurality of conductive wires are coupled to the bonding pad and extends away from the surface of the semiconductor chip. The surface of the semiconductor chip and the periphery of the plurality of conductive wires are covered with a resin layer. Each of the conductive wires and the resin layer covering the periphery of the conductive wire forms a coaxial body. A plurality of solder balls are mounted on the top end portion of the coaxial bodies and are electrically coupled with the conductive wires. Reinforcement resin portions are provided each of which is attached to an area from an upper end portion of the coaxial body to the solder ball to reinforce the coupling of the solder ball with the coaxial body.

11 Claims, 7 Drawing Sheets

PRIOR ART

FIG. 8

PRIOR ART

SEMICONDUCTOR DEVICE HAVING RELIABLE COUPLING WITH MOUNTING SUBSTRATE

FIELD OF THE INVENTION

The present invention relates generally to semiconductor devices and processes, and more particularly to a semiconductor device which has a downsized package structure of a Ball Grid Array (BGA) type, a Chip Size Package (CSP) type, or the like and which has reliable coupling with a mounting substrate.

BACKGROUND OF THE INVENTION

Figure 7:
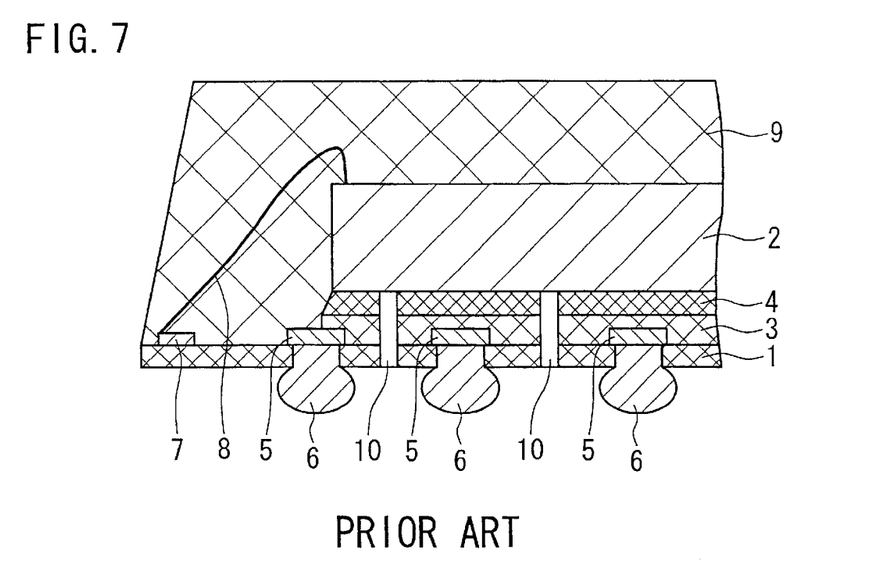
FIG. 7 is a cross sectional view showing a semiconductor device having a conventional package structure of a prior art 1.

FIG. 7 is a cross sectional view showing a semiconductor device having a conventional package structure which is disclosed in Japanese patent laid-open publication No. 11-243160 and which is hereafter referred to as prior art 1. In the structure shown in FIG. 7, a semiconductor chip 2 is bonded and fixed onto a Tape Automated Bonding (TAB) tape 1 via two layers comprising adhesive resin layers 3 and 4. Pads 5 provided on the TAB tape 1 are coupled, via holes formed in the TAB tape 1, with solder balls 6 which protrude from the lower surface of the TAB tape 1. Also, each electrode (not shown in the drawing) of the semiconductor chip 2 is coupled, via a bonding wire 8, with a bonding pad 7 formed on the TAB tape 1. The pads 5 and the bonding pads 7 are mutually coupled via wiring patterns (not shown in the drawing) formed on the TAB tape 1. Further, the semiconductor chip 2 is sealed or encapsulated with an encapsulation resin portion 9. A reference numeral 10 designates a hole for evacuating vapor or moisture.

Figure 8:
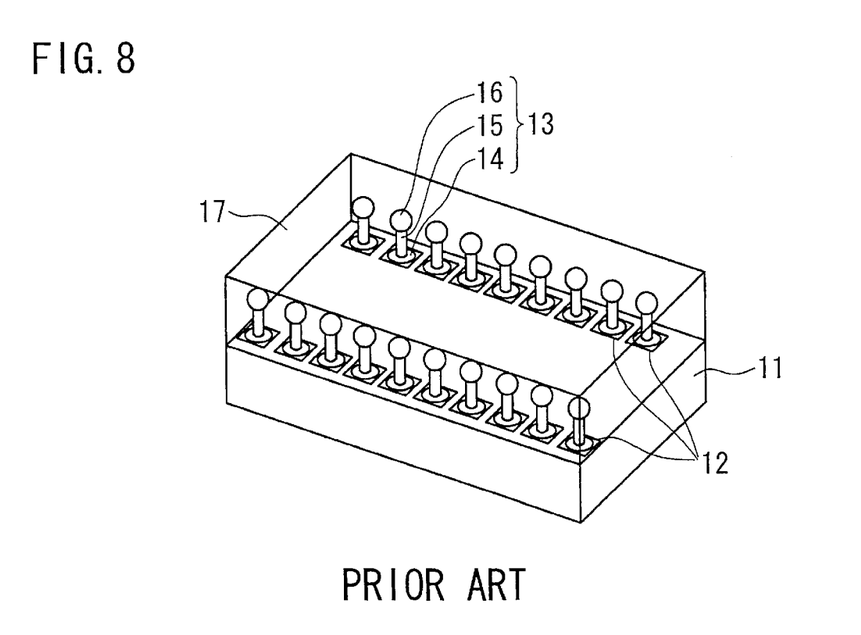
FIG. 8 is a perspective view showing another semiconductor device having a conventional bump structure of a prior art 2.

FIG. 8 is a perspective view showing another conventional semiconductor device having different bump structure which is disclosed in Japanese patent laid-open publication No. 10-303244 and which is hereafter referred to as prior art 2. In the structure shown in FIG. 8, a plurality of pads 12 are formed on a semiconductor chip 11. Also, a plurality of bumps 13 are provided, each of which is disposed on the pad 12 and each of which protrudes at a predetermined angle from the pad 12 toward upside of the semiconductor chip 11. Each of the bumps 13 has a coupling portion 14 which contacts the pad 12, a wire portion 15 which extends from the coupling portion 14, and a terminal portion 16 which is formed on the top portion of the wire portion 15 and which has a round shape. The bumps 13 are covered by a thermosetting resin portion 17. The thermosetting resin portion 17 is partially polished away to expose only the top end portions of the bumps 13, i.e., the terminal portions 16.

The conventional bump structure shown in FIG. 8 is fabricated as follows. First, a wire is connected to each of the pads 12 by using a wire bonder. In this case, a round coupling portion 14 is formed at a portion on each of the pads 12 where the wire and the corresponding pad 12 are connected. Also, a round terminal portion 16 is formed at the upper end of each of wire portions 15. Thereafter, thermosetting resin 17 is supplied onto the semiconductor chip 11 such that the thermosetting resin 17 fills the space among the bumps 13. The thermosetting resin 17 is then cured and thereby the semiconductor chip 11 is encapsulated. Thereafter, the thermosetting resin 17 is polished to expose the terminal portion 16 of each of the bumps 13. Thereby, the semiconductor device having the bumps in which a length from each coupling portion 14 to the terminal portion 16 is relatively long.

However, in the semiconductor device having the package structure of the above-mentioned prior art 1, the TAB tape as the substrate 1 and adhesive, that is, the adhesive resin layers 3 and 4, are required. Also, in order to electrically couple from the semiconductor chip 2 to the solder balls 6 as external electrodes, it is necessary to use the bonding wires 8, the pads 7, wiring patterns (not shown in the drawing) on the TAB tape, and the pads 5. Therefore, the wiring structure becomes complicated and manufacturing costs of the package becomes high.

Also, in the semiconductor device having the package structure of the prior art 1, it is impossible obtain a BGA type package having approximately the same size as that of the semiconductor chip 2. Therefore, it is difficult to downsize the BGA package type semiconductor device.

On the other hand, in the semiconductor device having the package structure of the above-mentioned prior art 2, a substrate, adhesive and the like are not required. However, after filling the space among the bumps 13 with the thermosetting resin 17, it is necessary to polish the thermosetting resin 17 such that the spherical terminal portions 16 at the upper ends of the bumps 13 are exposed. Therefore, manufacturing process becomes complicated, and manufacturing costs become high.

SUMMARY OF THE INVENTION

Therefore, it is an object of the present invention to provide a semiconductor device having a reliable package structure which can be manufactured by a simple process and at low cost.

It is another object of the present invention to provide a semiconductor device having a reliable package structure which can be manufactured at low cost and which facilitates downsizing of the semiconductor device.

It is still another object of the present invention to provide a semiconductor device which has a package structure manufactured at low cost and providing high reliability of electrical connection between the semiconductor device and an external circuit.

It is still another object of the present invention to obviate the disadvantages of the package structures of the conventional semiconductor devices.

According to an aspect of the present invention, there is provided a semiconductor device comprising: a semiconductor chip; a plurality of bonding pads formed on a surface of the semiconductor chip; a plurality of conductive wires each of which is coupled to the bonding pad and extends away from the surface of the semiconductor chip; a resin layer covering the surface of the semiconductor chip and covering the periphery the plurality of conductive wires, each of the conductive wires and the resin layer covering the periphery of the conductive wire forming a coaxial body; a plurality of solder balls each of which is mounted on the top end portion of the coaxial body and is electrically coupled with the conductive wire; and reinforcement resin portions each of which is attached to an area from an upper end portion of the coaxial body to the solder ball to reinforce the coupling of the solder ball with the coaxial body.

In this case, it is preferable that the reinforcement resin portions comprise resin material which is included in flux with resin used for coupling the solder balls to the conductive wires and which is left after a reflow process of the flux with resin.

It is also preferable that each of the conductive wires has a length of 300 to 1000 micrometers.

It is further preferable that the conductive wires extend vertically from the surface of the semiconductor chip.

It is advantageous that the coaxial body comprising the conductive wire and the resin layer covering the periphery of the conductive wire is deformable.

It is also advantageous that the conductive wires are made of gold or gold alloy.

It is further advantageous that, in the coaxial body comprising the conductive wire and the resin layer covering the periphery of the conductive wire, an upper end portion of the resin layer covering the conductive wire is removed by a predetermined depth to form a step portion, and the reinforcement resin portion is attached to an area from the step portion to the solder ball.

It is advantageous that the reinforcement resin portions comprise resin material which is included in flux with resin used for coupling the solder balls to the conductive wires and which is left after a reflow process of the flux with resin.

It is also advantageous that each of the conductive wires has a length of 300 to 1000 micrometers.

It is further advantageous that the conductive wires extend vertically from the surface of the semiconductor chip.

It is preferable that the coaxial body comprising the conductive wire and the resin layer covering the periphery of the conductive wire is deformable.

According to another aspect of the present invention, there is provided a method of manufacturing a semiconductor device comprising: providing a semiconductor chip having a plurality of bonding pads formed on a surface of the semiconductor chip; coupling a plurality of conductive wires onto the bonding pads by wire bonding such that the conductive wires extend away from the surface of the semiconductor chip; applying a resin layer on the surface of the semiconductor chip and on the periphery the plurality of conductive wires, each of the conductive wires and the resin layer covering the periphery of the conductive wire forming a coaxial body; exposing top end portion of each of the conductive wires by removing the resin layer from the upper end portion of the coaxial bodies; disposing flux with resin on the top end portions of the coaxial bodies; and disposing solder balls on the top end portions of the coaxial bodies via the flux with resin and coupling the solder balls with the conductive wires of the coaxial bodies by a reflow process; whereby flux component of the flux with resin disappears by the reflow process, and remained resin component of the flux with resin fills gaps between the solder balls and the coaxial bodies to reinforce the coupling force of the solder balls with the coaxial bodies.

In this case, it is preferable that, in the exposing the top end portion of each of the conductive wires by removing the resin layer from the upper end portion of the coaxial bodies, the resin layer is removed by grinding or etching.

It is also preferable that, in the exposing the top end portion of each of the conductive wires by removing the resin layer from the upper end portion of the coaxial bodies, top end portions of the coaxial bodies are cut away to expose the top end portion of each of the conductive wires.

It is further preferable that each of the conductive wires has a length of 300 to 1000 micrometers.

It is advantageous that the conductive wires are made of gold or gold alloy.

According to still another aspect of the present invention, there is provided a method of manufacturing a semiconductor device comprising: providing a semiconductor chip having a plurality of bonding pads formed on a surface of the semiconductor chip; coupling a plurality of conductive wires onto the bonding pads by wire bonding such that the conductive wires extend away from the surface of the semiconductor chip; applying a resin layer on the surface of the semiconductor chip such that the plurality of conductive wires are buried in the resin layer; removing the upper portion of the resin layer to expose top end portion of each of the conductive wires, and removing the resin layer further from portions between the conductive wires while leaving the resin layer thinly at the periphery of each of the conductive wires as an upper portion coating resin layer; applying flux with resin on whole area over the semiconductor chip; disposing solder balls on the top end portions of the conductive wires via the flux with resin and coupling the solder balls with the conductive wires by a reflow process; removing the resin layer further from portions between the conductive wires while leaving the resin layer at the lower periphery of each of the conductive wires as a lower portion coating resin layer which is thicker than the upper portion coating resin layer, thereby forming a step portion between the upper portion coating resin layer and the lower portion coating resin layer; whereby flux component of the flux with resin disappears by the reflow process, and remained resin component of the flux with resin fills portions from the solder balls to the upper portion coating resin layer to reinforce the coupling force of the solder balls with the conductive wires and the upper portion coating resin layer.

In this case, it is preferable that, in the removing the upper portion of the resin layer to expose top end portion of each of the conductive wires, and removing the resin layer further from portions between the conductive wires while leaving the resin layer thinly at the periphery of each of the conductive wires as an upper portion coating resin layer, the resin layer is removed by using a dicer or a laser beam It is also preferable that, in the removing the resin layer further from portions between the conductive wires while leaving the resin layer at the lower periphery of each of the conductive wires as a lower portion coating resin layer which is thicker than the upper portion coating resin layer, the resin layer is removed by using a dicer or a laser beam.

BRIEF DESCRIPTION OF THE DRAWINGS

These and other features, and advantages, of the present invention will be more clearly understood from the following detailed description taken in conjunction with the accompanying drawings, in which like reference numerals designate identical or corresponding parts throughout the figures, and in which.

DESCRIPTION OF A PREFERRED EMBODIMENTS

With reference to the attached drawings, embodiments of the present invention will be now described in detail.

Figure 1:
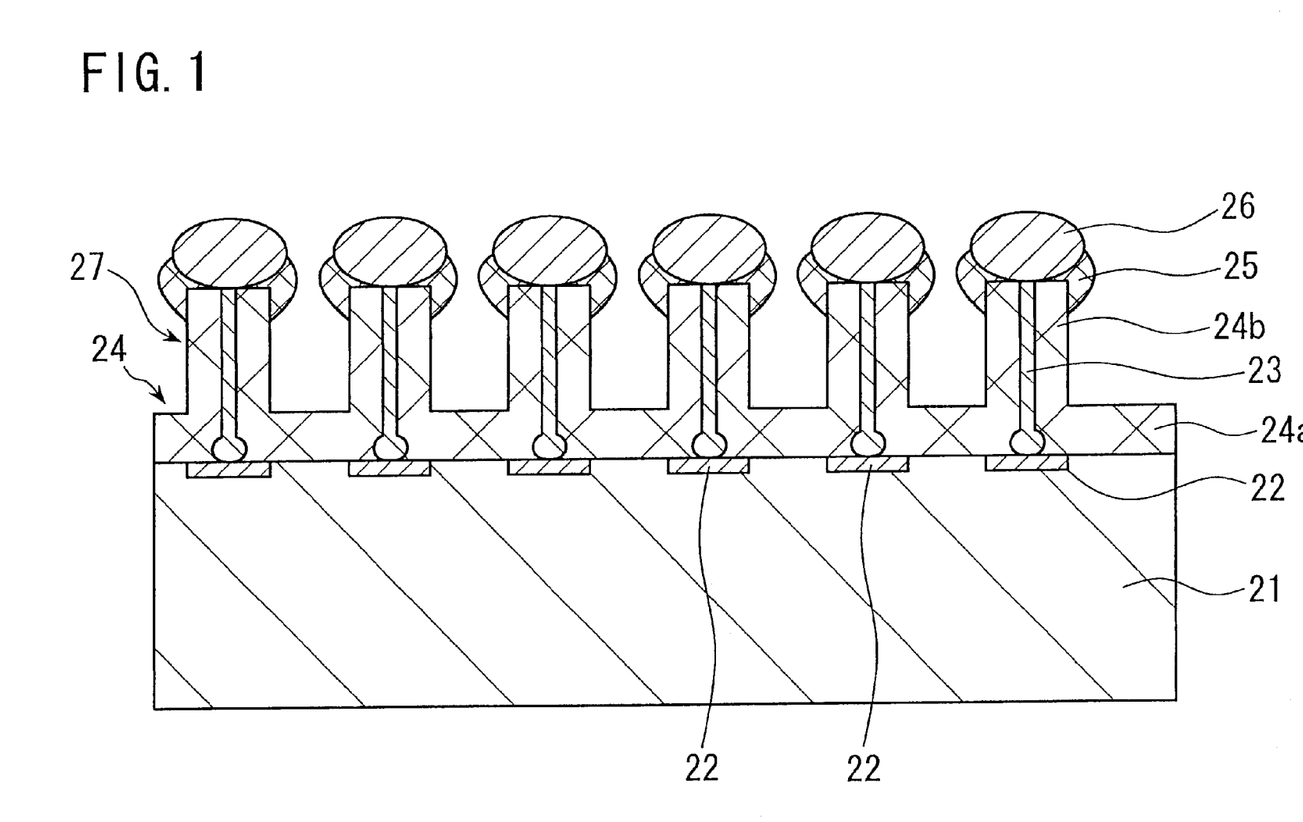
FIG. 1 is a cross sectional view showing a semiconductor device according to a first embodiment of the present invention.

FIG. 1 is a cross sectional view showing a semiconductor device according to a first embodiment of the present invention. In the semiconductor device shown in FIG. 1, a plurality of pads or bonding pads 22 are formed on a surface of a semiconductor chip 21. Although not shown in the drawing, various circuit elements of the semiconductor device are also formed on the surface of the semiconductor chip 21. A coupling wire 23 made, for example, of gold, gold alloy or the like is coupled onto each of the pads 22 and extends away vertically with respect to the surface of the semiconductor chip 21. The surface of the semiconductor chip 21 is coated with a thin resin layer 24a, and the periphery of each of the coupling wires 23 is also coated with a thin resin layer 24b. Each coupling wire 23 and the corresponding resin layer 24b coating the coupling wire 23 form a coaxial body 27 in which the coupling wire 23 constitutes the center thereof. Upper end surface of each of the coaxial bodies 27 is ground or cut such that the upper end surface forms a flat surface. In the upper end surface of each of the coaxial bodies 27, an end surface of the coupling wire 23 is exposed.

Onto the upper end surface of each of the coaxial bodies 27, a solder ball 26 is attached such that the solder ball 26 contacts, i.e., electrically connects to the upper end of the coupling wire 23. An each gap between the solder ball 26 and the coaxial body 27 is filled with a resin portion 25. The resin portion 25 reinforces the bonding force between the solder ball 26 and the coaxial body 27, and thus reinforces the bonding force between the solder ball 26 and the coupling wire 23. The resin portion 25 is produced from resin component contained in flux with resin which is used for coupling or mounting the solder ball 26 with the coupling wire 23. When the flux with resin or the flux containing resin is applied, for example, onto the coupling wire 23 and the solder ball 26 is bonded to the coupling wire 23 by using a reflow process, the flux component disappears by the reflow process and only the resin component remains around the solder ball 26 and the top end portion of the coaxial body 27 as the resin portion 25.

The BGA type semiconductor device having the above-mentioned structure has the merit of low manufacturing cost, and also has the merit of high bonding force of the solder ball 26 with the coaxial body 27. Also, the semiconductor device according to the present embodiment is mounted on a mounting substrate not shown in the drawing via the solder balls 26. In this case, differently from the conventional semiconductor devices shown in FIG. 7 and FIG. 8, there is a gap between the mounting substrate and the semiconductor chip 21, that is, the semiconductor chip 21 is mounted onto the mounting substrate via the coaxial bodies 27 each of which comprises the coupling wire 23 and the resin layer 24b and each of which has a predetermined length. Therefore, the stress caused by the difference of thermal expansion coefficient between the semiconductor chip 21 and the mounting substrate can be mitigated or obviated by gentle deformation of the coaxial bodies 27. Consequently, after mounting the semiconductor device, the solder balls 26 do not come off the mounting substrate.

Figure 2A:
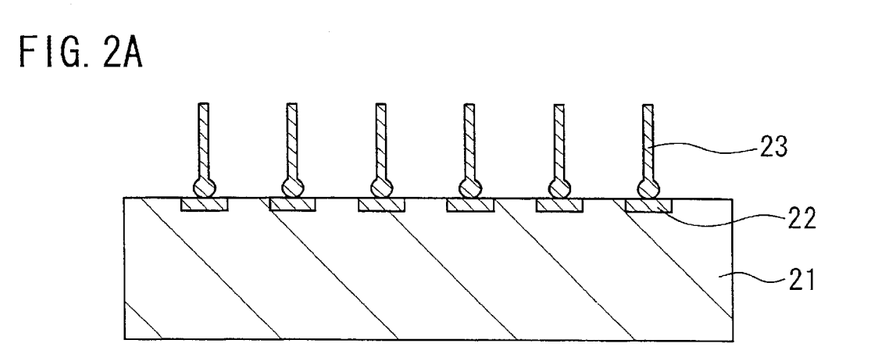
FIGS. 2A and 2B are cross sectional views illustrating process steps in a method of manufacturing the semiconductor device shown in FIG. 1, in order of the process steps.

Now, an explanation will be made on a method of manufacturing the above-mentioned semiconductor device. FIGS. 2A and 2B and FIGS. 3A and 3B are cross sectional views illustrating a method of manufacturing the semiconductor device shown in FIG. 1, in order of manufacturing steps. First, as shown in FIG. 2A, a coupling wire 23 is bonded onto each of pads 22 provided on a surface of a semiconductor chip 21 by wire bonding. The coupling wire 23 has, for example, a diameter of 30 $\mu$m, and is made of gold, gold alloy or the like. The coupling wires 23 are made to extend in a vertical direction from the surface of the semiconductor chip 21, and are cut, for example, at a length of 300–1000 $\mu$m.

Figure 2B:
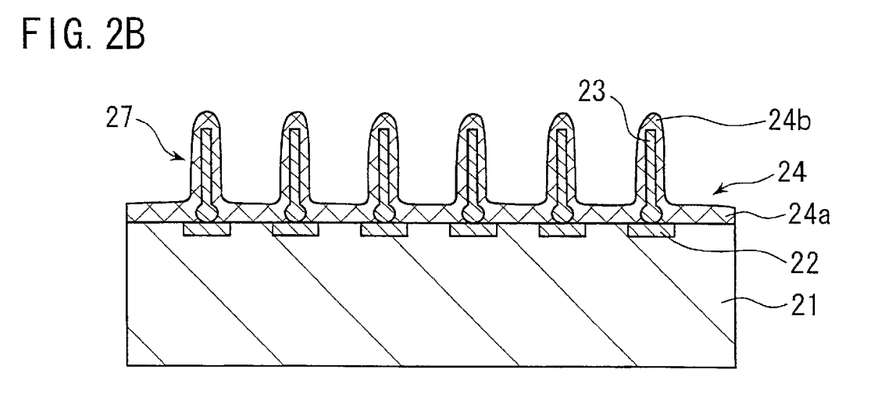

Next, as shown in FIG. 2B, a thin resin layer 24 is applied onto the surface of the semiconductor chip 21 and the coupling wires 23 to coat the semiconductor chip 21 and the coupling wires 23. Therefore, the resin layer 24 comprises a resin layer portion 24a which thinly covers the surface of the semiconductor chip 21 and resin layer portions 24b which thinly cover the coupling wires 23. Thereby, coaxial bodies 27 are obtained each of which comprises the coupling wire 23 and the resin layer portion 24b.

Figure 3A:
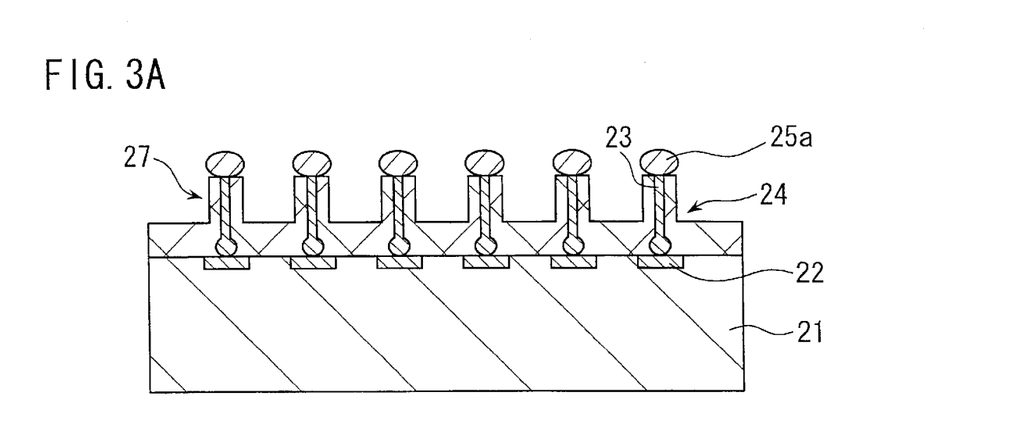
FIGS. 3A and 3B are cross sectional views illustrating process steps performed after the process steps shown in FIGS. 2A and 2B in the method of manufacturing the semiconductor device shown in FIG. 1, in order of the process steps.

As shown in FIG. 3A, at the top end of each of the coaxial bodies 27, the top portion of the resin layer portion 24b is removed by grinding or etching, and the top end portion of the coupling wire 23 is exposed. Thereafter, dirt and wastes at the top end portion of the coupling wire 23 are cleaned and removed, and flux with resin 25a is applied on the top end surface of each of the coaxial bodies 27. In this case, in place of removing the top portion of the resin layer portion 24b by grinding or etching, it is possible to cut the top portion of the coupling wire 23 as well as the top portion of the resin layer portion 24b away from the coaxial body 27. Since the top end surface of the coupling wire 23 is formed by cutting, the top end surface of the coupling wire 23 is clean and it is not necessary to clean and remove dirt and wastes at the top end surface of the coupling wire 23.

Figure 3B:
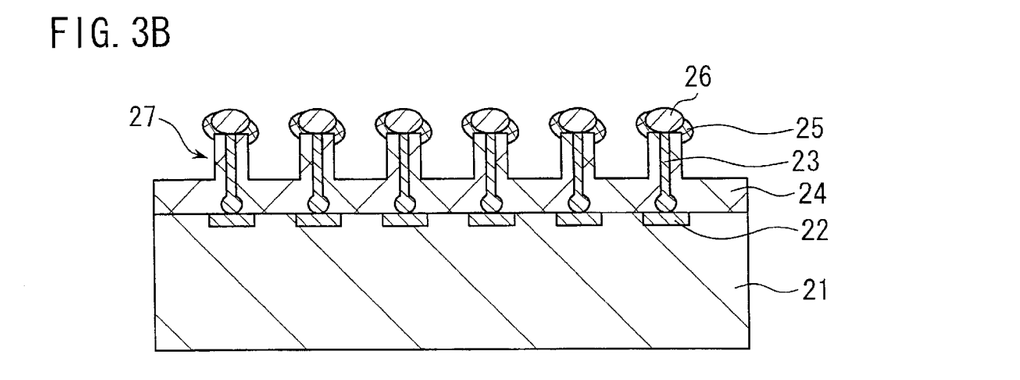

Thereafter, as shown in FIG. 3B, a solder ball 26 is attached onto each of the coupling wires 23 of the coaxial bodies 27 by using the flux 25a with resin, and a reflow process is performed to bond the solder ball 26 to the coupling wire 23. By this reflow process, flux component within the flux with resin 25a disappears, so that only the resin component remains and constitutes the resin portion 25. The resin portion 25 fills at least the gap between the solder ball 26 and the upper end portion of the coaxial body 27.

According to the above-mentioned method, a BGA type semiconductor device is fabricated by wire bonding the coupling wires 23 onto the surface of the semiconductor chip 21 such that the coupling wires 23 extend in a direction perpendicular to the surface of the semiconductor chip 21. Each of the coupling wires 23 is coated with the resin layer portion 24b to isolate or insulate between the coupling wires 23. Thereafter, by using the flux with resin 25a, the solder ball 26 is joined onto each of the coupling wires 23. Therefore, a manufacturing process can be simplified and manufacturing costs can be reduced. Also, the solder balls 26 are joined onto the coupling wires 23 by using the flux with resin 25a. Thus, after the flux disappears, the resin portion 25 is left between the solder ball 26 and the coaxial body 27 which includes the coupling wire 23 and the resin layer portion 24b, and thereby joining force between the solder ball 26 and the coaxial body 27 can be reinforced with the resin portion 25. That is, the resin portion 25 adheres to the solder ball 26 and the resin layer portion 24b, and reinforces the joining of the solder ball 26 with the coaxial body 27.

Figure 4:
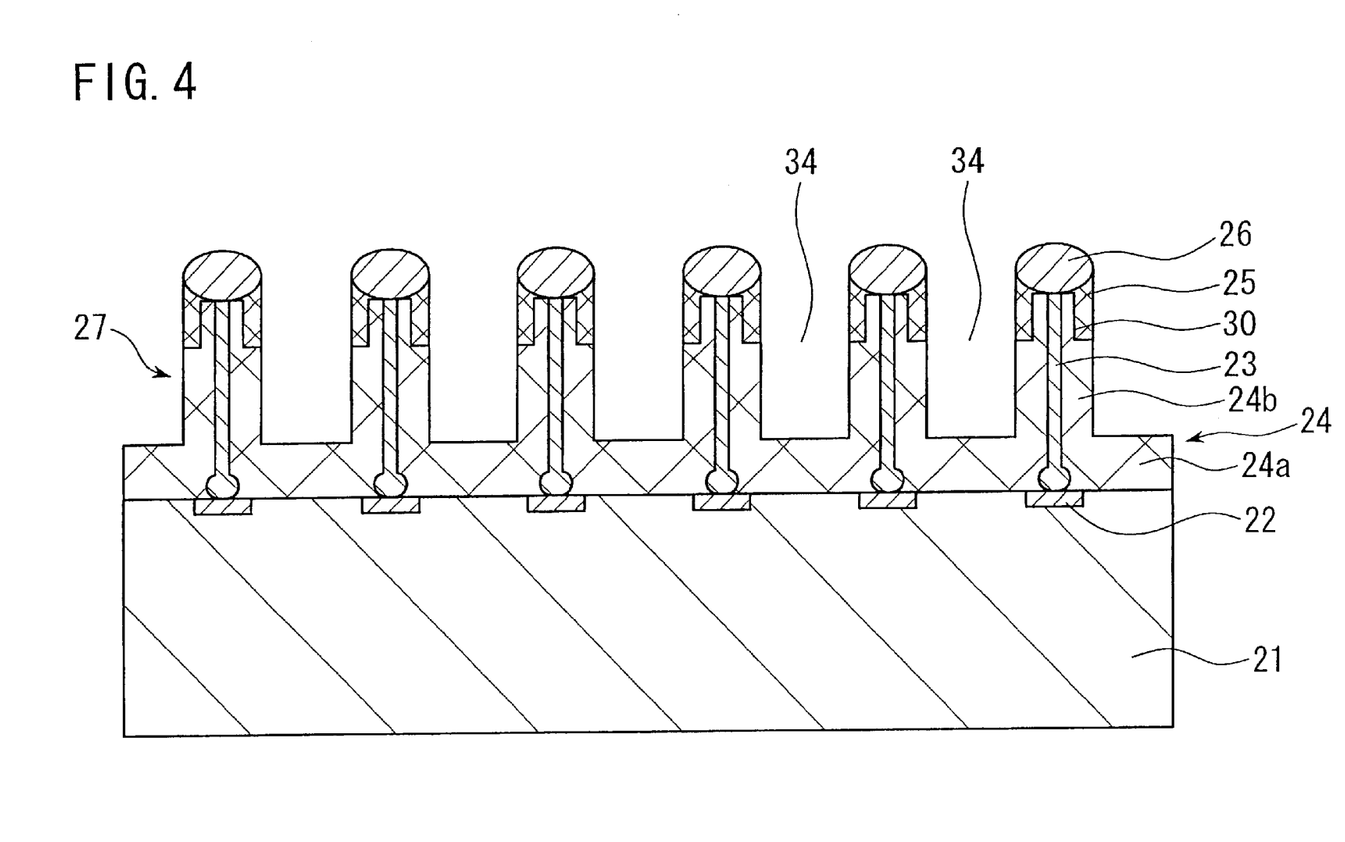
FIG. 4 is a cross sectional view showing the semiconductor device according to a second embodiment of the present invention.

Next, an explanation will be made on a semiconductor device according to a second embodiment of the present invention and on a method of manufacturing the semiconductor device according to the second embodiment. FIG. 4 is a cross sectional view showing the semiconductor device according to the second embodiment of the present invention. In FIG. 4, portions corresponding to those shown in FIG. 1 are designated by like reference numerals, and detailed description thereof is omitted here. In this embodiment, at the upper end portion of each resin layer portion 24b which coats the coupling wire 23 thinly, an outer surface is shaved off by a predetermined depth and thereby a step portion 30 is formed. A resin portion 25 produced from the flux with resin remains also in this step portion 30, and strongly reinforces the joining force between the solder ball 26 which is coupled to an upper end of the coupling wire 23 and a coaxial body 27.

In this embodiment, since the resin portion 25 for reinforcement is provided not only in the gap between the solder ball 26 and the resin layer portion 24b like the structure shown in FIG. 1, but also in the portion from the solder ball 26 to the step portion 30. Therefore, a relatively large quantity of resin of the resin portion 25 supports the solder ball 26, so that the joining force between the solder ball 26 and the coaxial body 27 becomes very large.

Figure 5A:
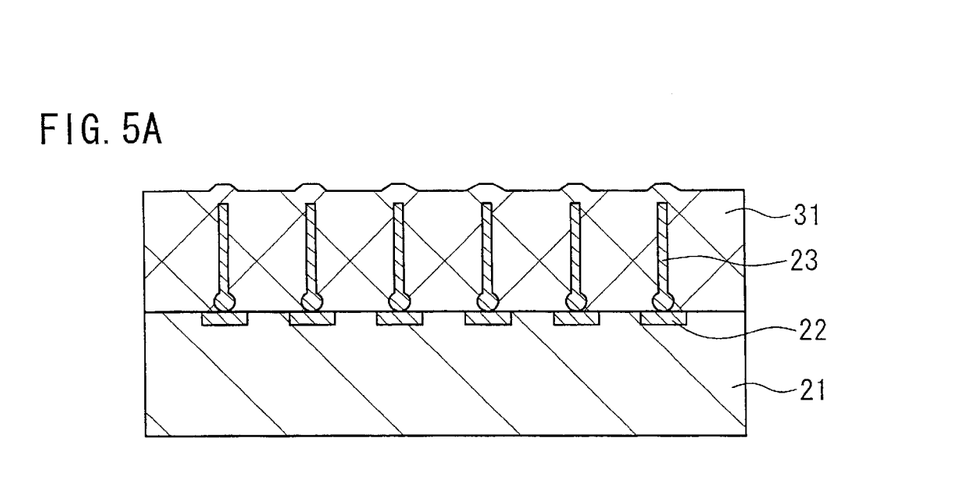
FIGS. 5A and 5B are cross sectional views illustrating process steps in a method of manufacturing the semiconductor device shown in FIG. 4, in order of the process steps.

An explanation will now be made on a method of manufacturing the above-mentioned BGA type semiconductor device according to the second embodiment of the present invention. FIGS. 5A and 5B and FIGS. 6A and 6B are cross sectional views illustrating the method of manufacturing the semiconductor device shown in FIG. 4, in order of manufacturing steps. First, as shown in FIG. 5A, a coupling wire 23 is bonded onto each of pads 22 provided on a surface of a semiconductor chip 21 by wire bonding. The coupling wire 23 has, for example, a diameter of 30 μm, and is made of gold, gold alloy or the like. The coupling wires 23 are made to extend in a vertical direction from the surface of the semiconductor chip 21, and are cut, for example, at a length of 300–1000 μm. Next, a thick resin layer 31 is applied onto the surface of the semiconductor chip 21 to fill gaps between the coupling wires 23 until the upper ends of the coupling wires 23 are submerged by the resin layer.

Figure 5B:
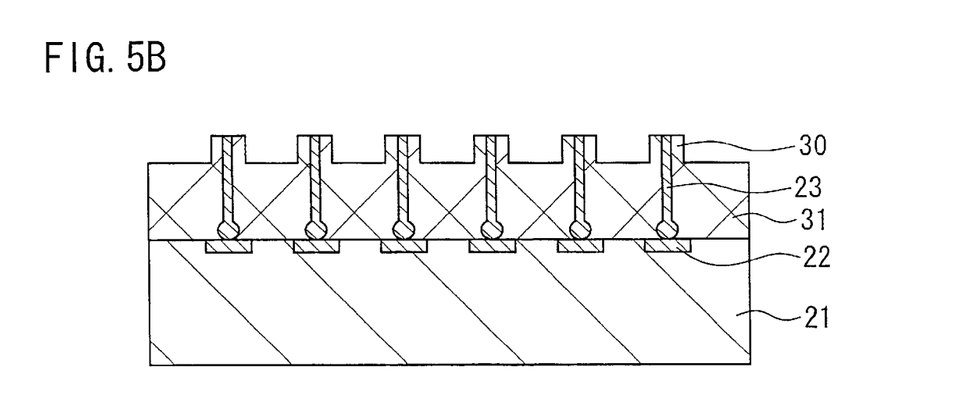

Thereafter, as shown in FIG. 5B, the upper surface portion of the resin layer 31 is removed by a dicer or by using a laser beam. In this case, approximately a third part of the thickness of the resin layer 31 is removed. In this case, it is also possible to remove a part of each of the coupling wires 23 as well as the part of the resin layer 31. Thereby, the top portions of the coupling wires 23 are exposed. Also, the resin layer 31 is slightly cut away from portions between the coupling wires 23 such that the resin layer 31 remains thinly at the periphery of the upper end portion of each of the coupling wires 23. Thereby, as shown in FIG. 5B, at the periphery of the upper end portion of each of the coupling wires 23, a column like projection which includes the coupling wire 23 at the center thereof and which becomes a step portion 30 is formed in the resin layer 31.

Figure 6A:
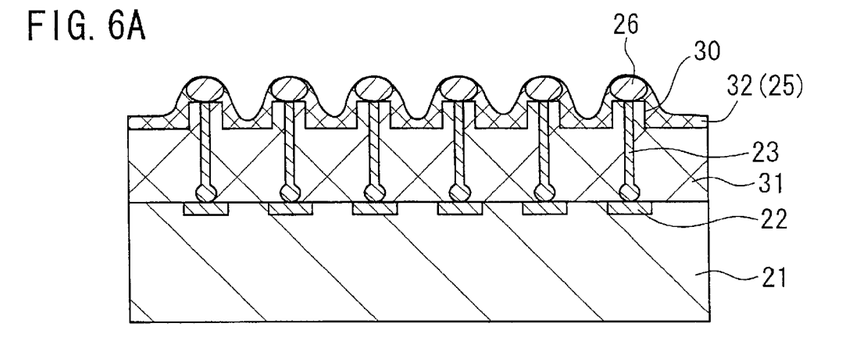
FIGS. 6A and 6B are cross sectional views illustrating process steps performed after the process steps shown in FIGS. 5A and 5B in the method of manufacturing the semiconductor device shown in FIG. 4, in order of the process steps.

Then, as shown in FIG. 6A, flux with resin 32 is applied over whole area of the workpiece. By using the flux with resin 32, a solder ball 26 is attached onto each of the coupling wires 23 of the coaxial bodies 27, and a reflow process is performed to bond the solder ball 26 to the coupling wire 23. By this reflow process, flux component within the flux with resin 32 disappears, so that the resin component remains and constitutes the resin portion 25. Since the flux with resin 32 was applied over whole area of the workpiece, a relatively large quantity of resin exists over the periphery of each solder ball 26 and of column like projection 30. Therefore, in this embodiment, each of the solder balls 26 is strongly fixed to the coaxial body 27 by the resin portion 25.

Figure 6B:
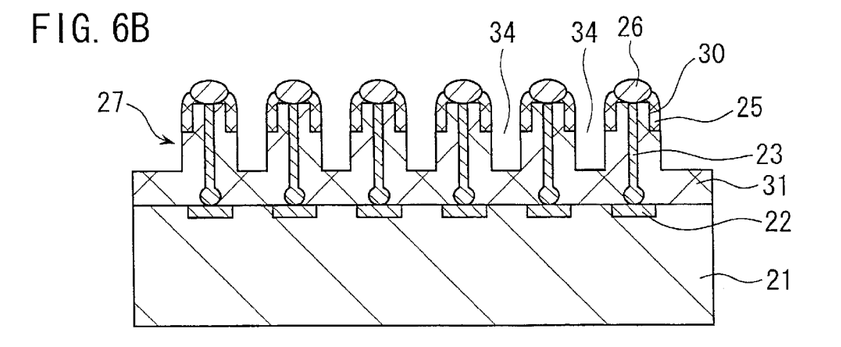

As shown in FIG. 6B, portions of the resin layer 31 and the resin portion 25 between the coupling wires 23 are additionally removed by using a dicer or a laser beam such that gaps 34 are formed between the coupling wires 23. Thereby, a structure is formed in which the resin layer 31 thinly remains on the surface of the semiconductor chip 21 and also the resin layer 31 thinly remains around the periphery of each coupling wire 23 to coaxially surround the coupling wire 23. Thereby, the coaxial bodies 27 are formed each comprising the coupling wire 23 and the resin layer 31. Also, at the upper end portion of each of the coaxial bodies 27, there is formed the step portion 30 in the resin layer 31, and, on the step portion 30, there remains the resin portion 25 produced after the flux component of the flux with resin 32 has disappeared due to the reflow process. By the resin portion 25 formed in this way, the bonding force of the solder balls 26 with the coaxial bodies 27 is reinforced. Since the resin portion 25 exists also on the step portion 30 and a large quantity of resin of the resin portion 25 exists on the step portion 30, the joining force of the solder ball 26 and the coaxial body 27 becomes very strong.

As mentioned above, according to the present invention, there is provided a semiconductor device which can be manufactured by a simple process and at low cost, and which has strong joining force between the solder balls and the coaxial bodies on the side of the semiconductor chip because of the reinforcement by the resin. Also, in the semiconductor device according to the present invention, the solder balls are attached to the coaxial bodies which have gaps therebetween and each of which has a predetermined length from the semiconductor chip. Therefore, the stress caused by the difference of thermal expansion coefficient between the semiconductor chip 21 and the mounting substrate can be mitigated or obviated by gentle deformation of the coaxial bodies. Consequently, after mounting the semiconductor device, the solder balls do not come off the mounting substrate. Further, by providing the step portion at the upper peripheral portion of each of the coaxial bodies, it is possible to dispose a large quantity of resin for supporting the solder ball at each of the step portions. Therefore, it is possible to more strongly reinforce the joining force of the solder balls.

Also, in the manufacturing method according to the present invention, after coating the coupling wire with the resin layer, the top end portions of the coupling wires are exposed and solder balls are bonded to the top end portions of the coupling wires. Therefore, manufacturing process can be simplified and manufacturing costs can be reduced.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative sense rather than a restrictive sense, and all such modifications are to be included within the scope of the present invention. Therefore, it is intended that this invention encompasses all of the variations and modifications as fall within the scope of the appended claims.

What is claimed is:

1. A semiconductor device comprising:

a semiconductor chip;

a plurality of bonding pads on a surface of said semiconductor chip;

a plurality of conductive wires, each of which is coupled to a respective one of said bonding pads and extends away from said surface of said semiconductor chip;

a resin layer covering said surface of said semiconductor chip and covering a periphery of each of said plurality of conductive wires, each of said conductive wires and said resin layer covering the periphery of said conductive wire forming a coaxial body;

a plurality of solder balls, each of which is mounted on a top end portion of a respective said coaxial body and is electrically coupled with a respective said conductive wire; and reinforcement resin portions, each of which is attached to an upper end portion of a respective said coaxial body and to a respective said solder ball to reinforce the coupling of said solder ball with said coaxial body.

2. A semiconductor device as in claim 1, wherein said reinforcement resin portions comprise resin material which is included in flux used for coupling said solder balls to said conductive wires and which is left after a reflow of said flux.

3. A semiconductor device as in claim 1, wherein each of said conductive wires has a length of 300 to 1000 micrometers.

4. A semiconductor device as in claim 1, wherein said conductive wires extend vertically from said bonding pads.

5. A semiconductor device as in claim 1, wherein said coaxial body is deformable.

6. A semiconductor device as in claim 1, wherein said conductive wires are made of gold or gold alloy.

7. A semiconductor device as in claim 1, wherein, in said coaxial body, an upper end portion of said resin layer is removed to a predetermined depth to form a step portion, and wherein said reinforcement resin portion is attached to said step portion and to said solder ball.

8. A semiconductor device as in claim 7, wherein said reinforcement resin portions comprise resin material which is included in flux used for coupling said solder balls to said conductive wires and which is left after a reflow of said flux.

9. A semiconductor device as in claim 7, wherein each of said conductive wires has a length of 300 to 1000 micrometers.

10. A semiconductor device as in claim 7, wherein said conductive wires extend vertically from said bonding pads.

11. A semiconductor device as in claim 7, wherein said coaxial body is deformable.

* * * * *